(12) United States Patent
Vitello et al.

(10) Patent No.: US 12,500,148 B2
(45) Date of Patent: Dec. 16, 2025

(54) METHOD OF COUPLING SEMICONDUCTOR DICE, TOOL FOR USE THEREIN AND CORRESPONDING SEMICONDUCTOR DEVICE

(71) Applicant: STMicroelectronics S.r.l., Agrate Brianza (IT)

(72) Inventors: Dario Vitello, Merate (IT); Michele Derai, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 721 days.

(21) Appl. No.: 17/872,893

(22) Filed: Jul. 25, 2022

(65) Prior Publication Data

US 2023/0035445 A1 Feb. 2, 2023

(30) Foreign Application Priority Data

Jul. 30, 2021 (IT) ......................... 102021000020537

(51) Int. Cl.
*H01L 23/495* (2006.01)
*H01L 21/48* (2006.01)
(Continued)

(52) U.S. Cl.
CPC .... *H01L 23/49527* (2013.01); *H01L 21/4825* (2013.01); *H01L 21/565* (2013.01);
(Continued)

(58) Field of Classification Search
None
See application file for complete search history.

(56) References Cited

U.S. PATENT DOCUMENTS 9,281,235 B2 3/2016 Kim et al.
11,133,281 B2 * 9/2021 Saw ..................... H01L 23/3121
(Continued)

FOREIGN PATENT DOCUMENTS

CN 112397397 A 2/2021
CN 112992689 A 6/2021
(Continued)

OTHER PUBLICATIONS

IT Search Report and Written Opinion for priority application, IT 102021000020537, report dated Apr. 1, 2022, 10 pgs.
(Continued)

*Primary Examiner* — Michael Lebentritt
(74) *Attorney, Agent, or Firm* — Crowe & Dunlevy LLC (57) ABSTRACT

An encapsulation of laser direct structuring (LDS) material is molded onto first and second semiconductor dice. A die-to-die coupling formation between the first and second semiconductor dice includes die vias extending through the LDS material to reach the first and second semiconductor dice and a die-to-die line extending at a surface of the encapsulation between the die vias. After laser activating and structuring selected locations of the surface of the encapsulation for the die vias and die-to-die line, the locations are placed into contact with an electrode that provides an electrically conductive path. Metal material is electrolytically grown onto the locations of the encapsulation by exposure to an electrolyte carrying metal cations. The metal cations are reduced to metal material via a current flowing through the electrically conductive path provided via the electrode. The electrode is then disengaged from contact with the locations having metal material electrolytically grown thereon.

13 Claims, 4 Drawing Sheets

(51) Int. Cl.
*H01L 21/56* (2006.01)
*H01L 23/31* (2006.01)

(52) U.S. Cl.
CPC .... *H01L 23/3107* (2013.01); *H01L 23/49513* (2013.01); *H01L 23/49575* (2013.01)

(56) References Cited

U.S. PATENT DOCUMENTS

| | | |
|---|---|---|
| 2009/0072379 A1 | 3/2009 | Ewe et al. |
| 2010/0019370 A1 | 1/2010 | Pressel et al. |
| 2011/0003440 A1 | 1/2011 | Mengel et al. |
| 2017/0084541 A1 | 3/2017 | Hsu et al. |
| 2018/0061767 A1 | 3/2018 | Chiang et al. |
| 2018/0224481 A1 | 8/2018 | Kim et al. |
| 2018/0342453 A1 | 11/2018 | Ziglioli |
| 2019/0115287 A1 | 4/2019 | Derai et al. |
| 2020/0203264 A1 | 6/2020 | Ziglioli |
| 2020/0321269 A1 | 10/2020 | Chiang et al. |
| 2020/0321274 A1 | 10/2020 | Magni |
| 2021/0050226 A1 | 2/2021 | Derai et al. |
| 2021/0050299 A1 | 2/2021 | Ziglioli et al. |
| 2021/0183748 A1* | 6/2021 | Derai ................ H01L 23/49827 |
| 2023/0049564 A1* | 2/2023 | Chiang ................ H01L 21/565 |
| 2023/0197585 A1* | 6/2023 | Cha ..................... H01L 23/3107 257/669 |
| 2024/0250062 A1* | 7/2024 | Jung ....................... H01L 24/19 |

FOREIGN PATENT DOCUMENTS

| | | | |
|---|---|---|---|
| CN | 218333795 U | * 1/2023 | |
| CN | 218867105 U | 4/2023 | |
| EP | 4125119 A1 | * 2/2023 | ....... H01L 23/49527 |

OTHER PUBLICATIONS

CN First Office Action and Search Report for counterpart CN Appl. No. 202210904043.7, report dated Jul. 23, 2023, 5 pgs.

* cited by examiner

METHOD OF COUPLING SEMICONDUCTOR DICE, TOOL FOR USE THEREIN AND CORRESPONDING SEMICONDUCTOR DEVICE

PRIORITY CLAIM

This application claims the priority benefit of Italian Application for Patent No. 102021000020537, filed on Jul. 30, 2021, the content of which is hereby incorporated by reference in its entirety to the maximum extent allowable by law.

TECHNICAL FIELD

The description relates to semiconductor devices.

One or more embodiments can be applied to semiconductor devices comprising die-to-die connections.

System-in-Package (SiP) including plural integrated circuits in one or more chip carrier packages may be exemplary of such devices.

BACKGROUND

Various types of semiconductor devices such as power devices, for instance, may involve die-to-die coupling.

A device where a power semiconductor integrated circuit chip or die (gallium nitride or GaN, for instance) is desired to be connected to a driver chip or die manufactured using BCD (Bipolar-CMOS-DMOS) technology may be exemplary of such an instance.

Laser direct structuring (LDS) technology has been recently proposed to replace conventional wire bonding in providing die-to-lead electrical connections in a semiconductor device.

In laser direct structuring technology as currently performed today, after laser beam structuring (activation) of the LDS material, electrical conductivity of formations such as vias and tracks (traces) is facilitated via electro-less metallization and galvanic plating to reach a metallization thickness of tens of microns of a metal material such as copper.

An issue arising in trying to apply LDS technology to die-to-die coupling lies in that the associated conductive patterns are electrically floating nodes.

The expected use of electroplating to facilitate adequate conductivity of the electrically conductive formations (vias and/or lines or tracks) structured via LDS technology thus militates against extending the use of LDS technology from die-to-lead coupling to die-to-die coupling.

There is a need in the art is to contribute in adequately dealing with such an issue.

SUMMARY

One or more embodiments relate to a method.

One or more embodiments relate to a corresponding tool (electrode).

One or more embodiments relate to a corresponding semiconductor integrated circuit device. A semiconductor device such as a power device comprising plural, mutually coupled semiconductor chips or dice may be exemplary of such device.

One or more embodiments provide a (temporary) electrical grounding for an otherwise isolated die-to-die connection to be exploited in growing electrically-conductive material (a metal such as copper, for instance) to portions of laser direct structuring (LDS) material that have been activated (structured) by applying laser beam energy.

One or more embodiments may involve using a stainless-steel reel positioned on top of LDS frames having (e.g., spring-like) fingers forming an electrical contact to die-to-die connection patterns.

One or more embodiments simplify die-to-die coupling without requiring appreciable changes in process flow.

In one or more embodiments, die-to-die connection lines or tracks may comprise landing areas to facilitate forming electrical contact (with increased area, for instance).

One or more embodiments provide an advantageous alternative to die-to-die coupling obtained with printing methods such as jet-printing.

BRIEF DESCRIPTION OF THE DRAWINGS

One or more embodiments will now be described, by way of example only, with reference to the annexed figures, wherein.

DETAILED DESCRIPTION

Corresponding numerals and symbols in the different figures generally refer to corresponding parts unless otherwise indicated.

The figures are drawn to clearly illustrate the relevant aspects of the embodiments and are not necessarily drawn to scale.

The edges of features drawn in the figures do not necessarily indicate the termination of the extent of the feature.

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment", "in one embodiment", or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

Figure 1:
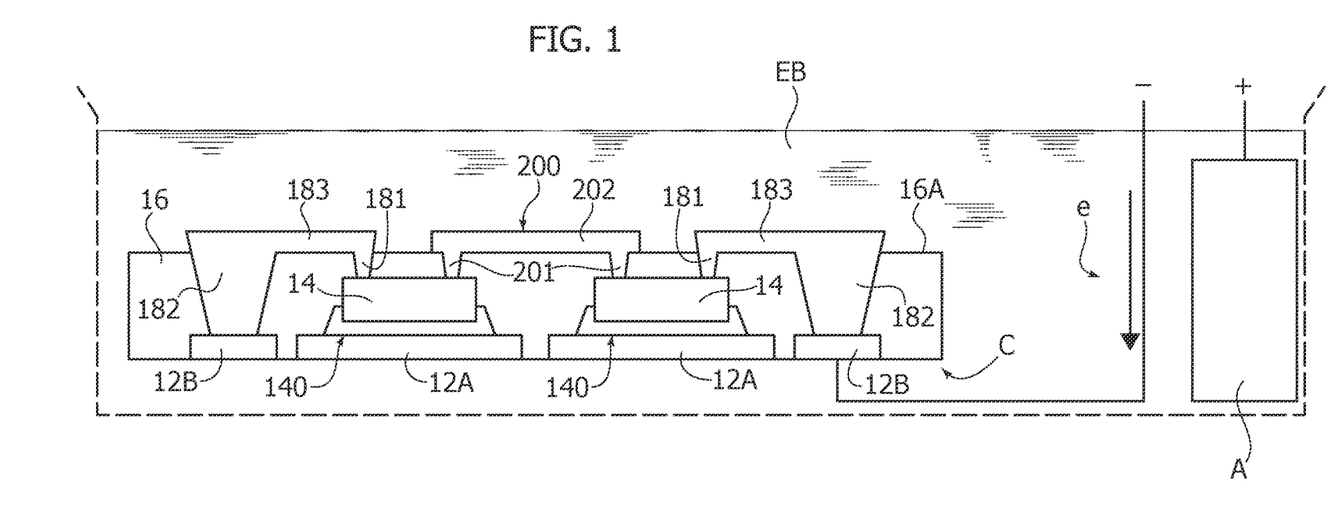
FIG. 1 is exemplary of the possible application of LDS technology to manufacturing semiconductor devices.
Figure 6:
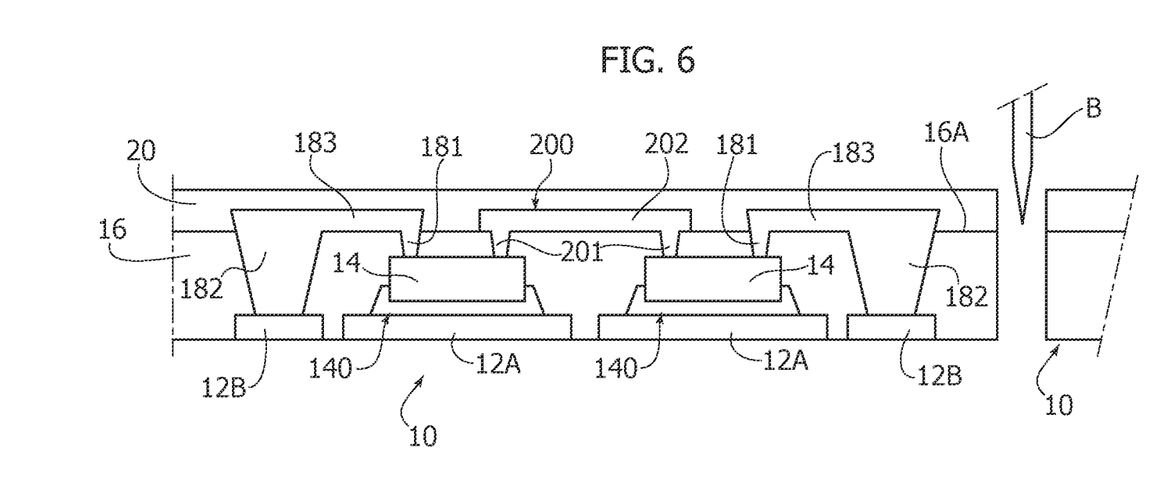

FIG. 1 is representative of a possible application of LDS technology in providing die-to-lead coupling in an assembly flow of plural semiconductor devices that are manufactured simultaneously and finally separated into individual devices via a singulation step (as exemplified in FIG. 6).

FIG. 1 refers to a (single) device comprising a leadframe having a plurality of die pads 12A (two die pads, for instance) onto which respective semiconductor integrated circuit chips or dice 14 are mounted (for instance attached via die attach material 140) with an array of leads 12B around the die pads 12A and the semiconductor chips or dice 14.

The designation "leadframe" (or "lead frame") is currently used (see, for instance the USPC Consolidated Glossary of the United States Patent and Trademark Office) to indicate a metal frame that provides support for an integrated circuit chip or die as well as electrical leads to interconnect the integrated circuit in the die or chip to other electrical components or contacts.

Essentially, a leadframe comprises an array of electrically-conductive formations (leads) that from an outline location extend inwardly in the direction of a semiconductor chip or die thus forming an array of electrically-conductive formations from a die pad configured to have at least one semiconductor chip or die attached thereon. This may be via conventional means such as a die attach adhesive (a die attach film (DAF) for instance).

In FIG. 1 two die pads 12A are illustrated having respective chips 14 attached thereon. In various embodiments plural chips 14 can be mounted on a single die pad 12A: for instance, instead of being distinct elements as illustrated in FIG. 1, the two die pads 12A may be joined to form a single die pad having two chips mounted thereon.

Laser Direct Structuring (LDS), oftentimes referred to also as direct copper interconnection (DCI) technology, is a laser-based machining technique now widely used in various sectors of the industrial and consumer electronics markets, for instance for high-performance antenna integration, where an antenna design can be directly formed onto a molded plastic part. In an exemplary process, the molded parts can be produced with commercially available resins that include additives suitable for the LDS process; a broad range of resins such as polymer resins like PC, PC/ABS, ABS, LCP are currently available for that purpose.

In LDS, a laser beam can be used to transfer a desired electrically-conductive pattern onto a plastic molding that may then be subjected to metallization (for instance via electroless plating with copper or other metals) to finalize a desired conductive pattern.

Documents such as United States Patent Application Publication Nos. 2018/0342453, 2019/0115287, 2020/0203264, 2020/0321274, 2021/0050226, 2021/0050299 or 2021/0183748 (all of which are incorporated herein by reference) are exemplary of the possibility of applying LDS technology in manufacturing semiconductor devices. For instance, LDS technology facilitates replacing wires, clips or ribbons with lines/vias created by laser beam processing of an LDS material followed by metallization (growing metal such as copper through plating process, for instance).

Still referring to FIG. 1, an encapsulation 16 of LDS material can be molded onto the leadframe 12A, 12B having the semiconductor chips or dice 14 mounted thereon.

Electrically-conductive die-to-lead coupling formations can be provided (in a manner known per se: see the published applications cited in the foregoing, for instance) in the LDS material 16.

As illustrated in FIG. 1, these die-to-lead coupling formations comprise: first vias 181, second vias 182 and electrically-conductive lines or tracks 183.

The first vias 181 extend through the LDS encapsulation 16 between the top (front) surface 16A of the encapsulation (opposed the leadframe 12A, 12B) and electrically-conductive pads (not visible for scale reasons) at the front or top surface of the chips or dice 14.

The second vias 182 extend through the LDS encapsulation 16 between the top (front) surface 16A of the encapsulation and corresponding leads 12B in the leadframe. The electrically-conductive lines or tracks 183 extend at the front or top surface 16A of the encapsulation 16 and electrically coupling selected ones of the first vias 181 with selected ones of the second vias 182 to provide a desired die-to-lead electrical connection pattern between the chips or dice 14 and the leads 12B.

Providing the electrically conductive die-to-lead formations (references 181, 182, and 183) essentially involves structuring these formations in the LDS material 16 (for instance, drilling holes therein at the desired locations for the vias 181, 182) followed by growing electrically-conductive material (a metal such as copper, for instance) at the locations activated (structured) via laser beam energy.

Further details on processing as discussed in the foregoing can be derived from the published applications cited in the foregoing, for instance.

Extending the use of LDS processing as discussed in the foregoing to producing die-to-die coupling formations is faced with an issue related to the very nature of these formations.

Such die-to-die coupling formations as indicated by 200 in FIG. 1 should desirably comprise: electrically-conductive vias 201 and electrically-conductive lines or tracks 202.

The electrically-conductive vias 201 extend through the LDS encapsulation 16 between the top (front) surface 16A of the encapsulation and die pads (not visible for scale reasons) at the top or front surface of the one and the other of two chips or dice 14 to be mutually connected.

The electrically-conductive lines or tracks 202 extend bridge-like between the first vias 201 at the front or top surface 16A of the encapsulation 16 to complete a desired die-to-die coupling pattern.

Laser beam structuring (also referred to as "activation") of the vias 201 and lines or tracks 202 in the LDS material of the encapsulation 16 can be performed in the same manner of structuring the vias 181, 182 and the lines or tracks 183 used to provide die-to-lead coupling formations as discussed previously.

A critical aspect arises in growing conductive material such as metal (via electroplating, for instance) at the structured locations to provide electrical conductivity as desired—just like in the case of the die-to-lead coupling formations.

Growing such conductive material currently involves (in addition to electroless plating) electroplating, based on the reduction to metal material (e.g., copper) of cations of the metal to be deposited contained in an electrolyte "bath" EB.

Cations such as Cu2+ cations are reduced to metallic copper at the cathode C by gaining electrons e from an electric current as schematically represented in FIG. 1 where A denotes the anode of the electrolyte bath containing the cations of the metal to be deposited.

For instance (as otherwise known to those of skill in the art) the electrolyte EB may contain (in the case of deposition of copper) Cu2+ cations and SO2-4 anions.

Such a process, that is the Cu2+ cations being reduced to metallic copper at the anode in order to produce a conductive path (and, consequently, a desired growth of electrically-conductive metal such as copper at the coupling formations 200) involves gaining electrons e from an electric current flowing vie the cathode C represented by the leadframe (e.g., by the leads 12B). Such a current simply cannot flow in an arrangement as illustrated in FIG. 1: there, the formations 200 are electrically isolated from the leadframe (by the chips 14) so that Cu2+ cannot be reduced to metal (copper).

It is noted that, at least in principle, such an issue could be addressed by resorting to LDS technology—only—to provide the die-to-lead electrically conductive formations 181, 182, 183, while other technologies are used to provide the die-to-die coupling as exemplified at 200 in FIG. 1.

Conventional wire bonding may represent a first candidate to consider for die-to-die coupling.

An undesirably high resistive path and/or stress applied on device bonding parts representing (negative) factors to take into account.

Providing the die-to-die coupling formations 200 via a conductive paste may be another option to consider.

It is noted that filling vias structured in the LDS material 16 with conductive paste may turn out to be unpractical due to paste viscosity.

Creating sacrificial paths within a structure as exemplified in FIG. 1 may be still another option to consider.

Again, such an approach is not exempt from drawbacks such as undesired antenna effects and possible resulting design constraints (especially in the case of devices including a high number of input/output connections).

One or more examples as considered herein exploit LDS technology fully (that is, also for die-to-die coupling at 200, 201, 202) without impact on the provision of die-to-lead coupling formations 181, 182, and 183.

Throughout FIGS. 2 to 8, parts or elements like parts or elements already discussed in connection with FIG. 1 are indicated with like reference symbols. A corresponding detailed description will not be repeated for brevity.

Figure 2:
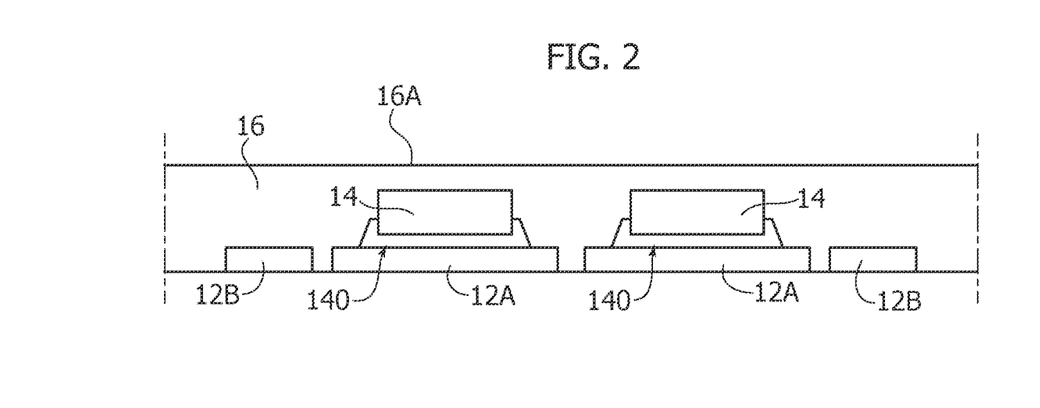
FIGS. 2 to 6 are exemplary of steps in embodiments of the present description.

FIG. 2 is exemplary of plural semiconductor dice or chips 14 (to be mutually coupled in die-to-die connection) are shown mounted on one or more die pads 12A in the leadframe via die attach material 140.

An encapsulation of LDS material 16 is molded onto the leadframe 12A, 12B having the semiconductor chips or dice 14 mounted thereon, with laser beam structuring (as indicated by LB in FIG. 3) applied to structure in the LDS material 16 (once consolidated, e.g., via thermosetting) to provide: the die-to-lead coupling formations 181, 182, and 183, as well as the die-to-die coupling formations 201, 202.

Figure 3:
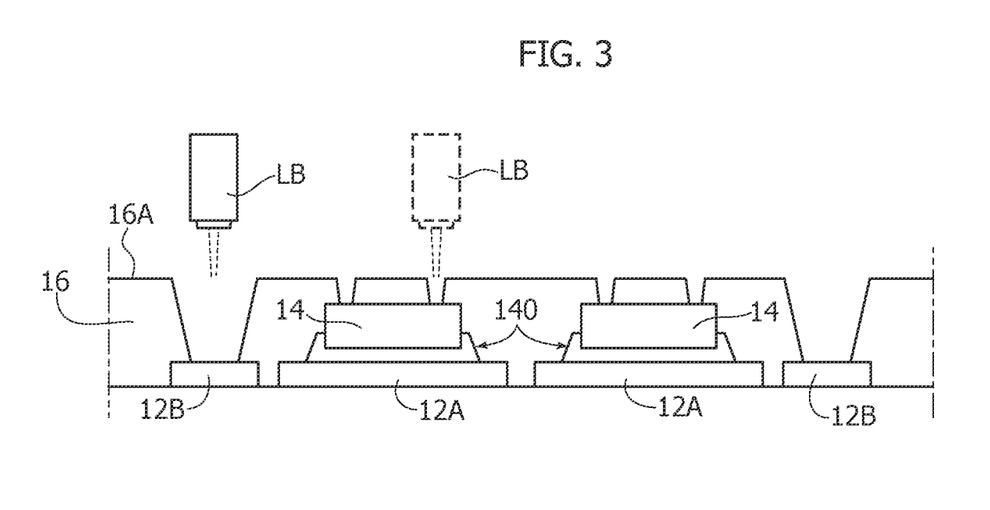

In order to avoid making the representation too cumbersome, the act and the effect of structuring via laser beam energy LB is exemplified in FIG. 3 without expressly referencing the laser-structured formations 181, 182, 183 and 201, 202.

Figure 4:
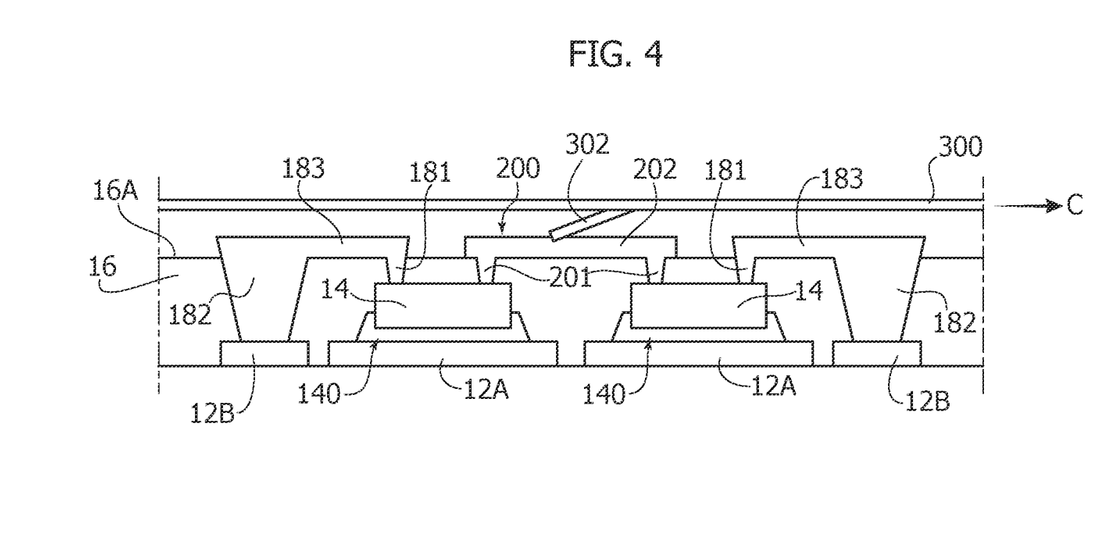

FIG. 4 is exemplary of an electrode 300, that is an electrically-conductive body such as a reel or tape of electrically-conductive material (a metal such as stainless steel, for instance) placed facing the structure onto which the formations 181, 182, 183 and 201, 202 have been structured via a laser beam energy LB.

As illustrated, the electrode 300 comprises contacts 302 (spring-like laminar contacts formed in the reel or strip by punching and bending may be exemplary of these) adapted to come into contact with the locations where the die-to-die connections 200 (vias 201 and lines or tracks 202) have been structured.

In that way (as exemplified in FIG. 8), those locations of the LDS material will have the possibility to be electrically connected (via the electrode 300) with the cathode of the electroplating process.

Selecting a material such as a stainless steel for the electrode 300 may be advantageous since steel will not be plated by copper thanks to its chromium (Cr) content (layer).

Figure 5:
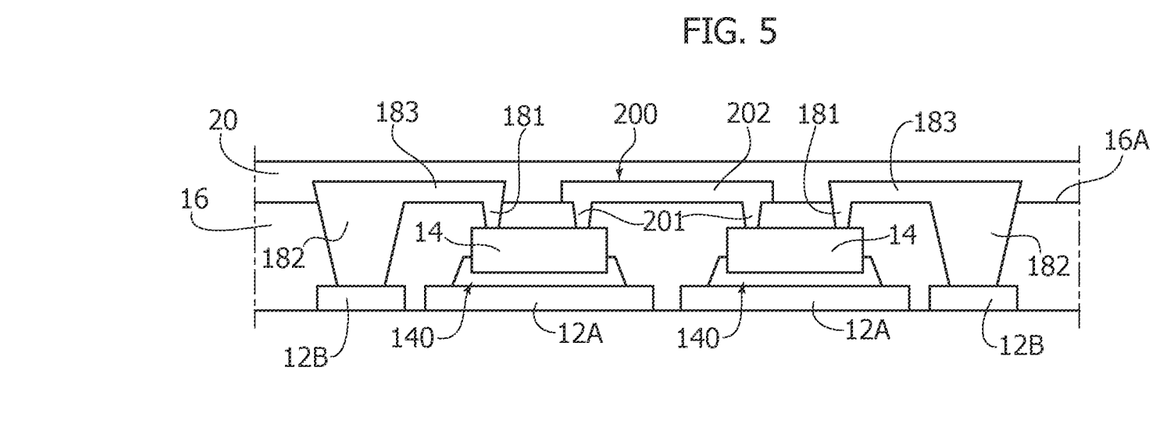

Due to the presence of the electrode 300, metal such as copper can be grown at the laser-activated locations at the front or top surface 16A of the LDS material 16 not just to provide the electrical die-to-lead coupling (vias 181, 182, and lines or tracks 183) but also to provide the electrical die-to-die coupling (vias 201 and lines or tracks 202): see FIG. 5, also with reference to FIG. 1.

Figure 7:
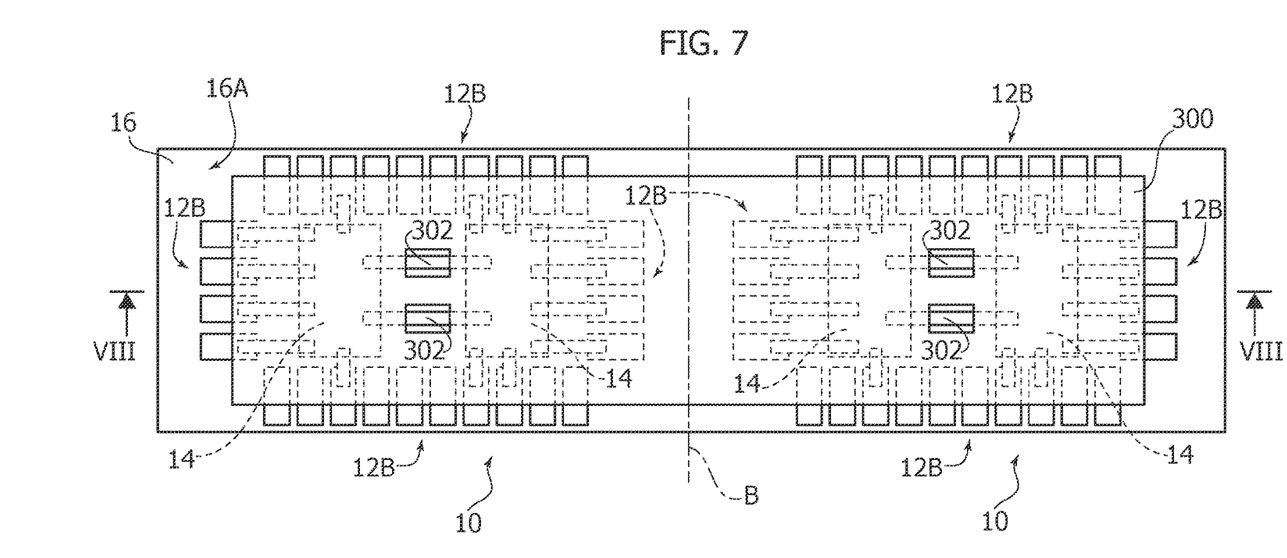
FIG. 7 is a plan view further detailing a possible implementation of the step of FIG. 4.
Figure 8:
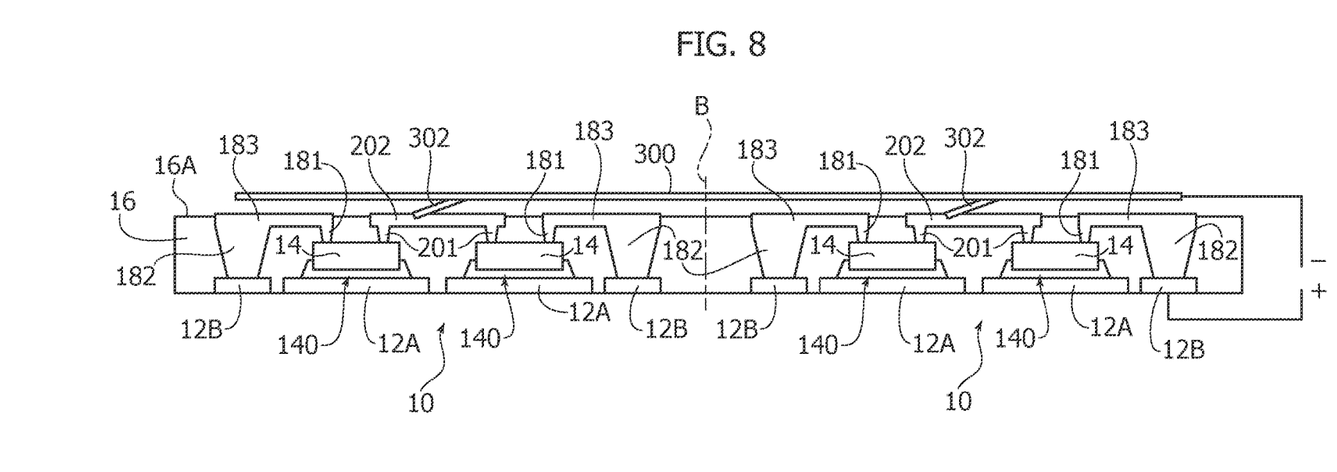
FIG. 8 is a cross-sectional view along line VIII-VIII of FIG. 7.

Further encapsulation material 20 (this may be non-LDS material, such as conventional epoxy resin molding compound, for instance) can be molded onto the structure to complete the device package and individual devices 10 can be produced via conventional singulation (by blade cutting, for instance) as exemplified at B in FIG. 6. FIGS. 7 and 8 are exemplary of the possibility of implementing the electrode 300 using an external reel that is removed once the plating process is completed.

FIGS. 7 and 8 are exemplary of the possibility of using a single reel to provide electrical contact as desired for plural devices 10 manufactured simultaneously in a strip as well as for multiple strips.

Examples as discussed herein were found to provide better performance in comparison with wire bonding used in die-to-die connection due, e.g., to the possibility of providing a connection path with lower resistivity while avoiding stresses applied to device bonding pads and additional assembly steps.

In comparison with a conductive paste used for die-to-die bonding, examples herein have the advantage of avoiding filling issues of the vias and, more to the point, additional dispensing steps.

In comparison with the provision of sacrificial paths within the device structure, one or more examples as discussed herein have the advantage of avoiding antenna effects and design constraints, particularly in the case of a high number of I/O nodes.

An additional advantage may be related to the fact that an electrode 300 as exemplified herein provides a straight electrical path (no tortuous layout) in the electrode position configuration.

Possible markings left by the contacts 302 of the electrode 300 at the connections 200 (at the lines or tracks 202, for instance) are hardly noticeable and, in any case, have no negative impact on device performance.

Without prejudice to the underlying principles, the details and embodiments may vary, even significantly, with respect to what has been described by way of example only without departing from the extent of protection.

The claims are an integral part of the technical teaching provided herein in respect of the embodiments.

The extent of protection is determined by the annexed claims.

The invention claimed is:

1. A method, comprising:
arranging a first semiconductor die and a second semiconductor die on a substrate;
molding an encapsulation of laser direct structuring (LDS) material onto the first semiconductor die and the second semiconductor die arranged on the substrate, the encapsulation of LDS material having a surface opposite the substrate;
providing at least one electrically conductive die-to-die coupling formation between the first semiconductor die and the second semiconductor die, the at least one die-to-die coupling formation comprising: die vias extending through the LDS material between the surface of the encapsulation of LDS material opposite the substrate and each of the first semiconductor die and the second semiconductor die and a die-to-die line extending at the surface of the encapsulation of LDS material opposite the substrate and coupling said die vias;

wherein providing said at least one electrically conductive die-to-die coupling formation comprises:

applying laser beam energy to selected locations of the surface of the encapsulation of LDS material opposite the substrate to laser activate the LDS material and structure therein said die vias and said die-to-die line;

placing said selected locations of the surface of the encapsulation of LDS material opposite the substrate that are laser activated and structured into contact with an electrode wherein the electrode provides an electrically conductive path to said selected locations; and electrolytically growing metal material onto said selected locations of the surface of the encapsulation of LDS material that are laser activated and structured, wherein electrolytically growing metal material comprises exposing said selected locations to an electrolyte carrying cations of metal material and reducing said cations to metal material via a current flowing through the electrically conductive path provided via said electrode.

2. The method of claim 1, comprising disengaging the electrode from contact with said selected locations having metal material electrolytically grown thereon.

3. The method of claim 1, wherein electrolytically growing metal material onto said selected locations of the surface of the encapsulation of LDS material that are laser activated and structured comprises exposing said selected locations to an electrolyte carrying copper cations and reducing said cations to metallic copper via a current flowing through the electrically conductive path provided via said electrode.

4. The method of claim 3, wherein said electrolyte carries SO2-4 anions.

5. The method of claim 1, wherein the electrode comprises a laminar body having contact members protruding therefrom, and wherein placing said selected locations of the surface of the encapsulation of LDS material that are laser activated and structured into contact with said electrode comprises arranging the laminar body of the electrodes facing the surface of the encapsulation of LDS material wherein said contact members protruding therefrom come into contact with said selected locations of the surface of the encapsulation of LDS material that are laser activated and structured.

6. The method of claim 5, wherein said contact members protruding from the laminar body of the electrode are deformable in response to coming into contact with said selected locations of the surface of the encapsulation of LDS material that are laser activated and structured.

7. The method of claim 1, comprising:

arranging said first semiconductor die and said second semiconductor die on at least one die pad in said substrate, the substrate comprising an array of electrically conductive leads around said at least one die pad; and applying LDS processing to said encapsulation of LDS material to provide die-to-lead electrically conductive formations coupling said first semiconductor die and second semiconductor die with selected ones of said electrically conductive leads in said array of electrically conductive leads, wherein said die-to-lead electrically conductive formations comprise:

first vias extending through the LDS material between the surface of the encapsulation of LDS material opposite the substrate and the first semiconductor die and the second semiconductor die;

second vias extending through the LDS material between the surface of the encapsulation of LDS material opposite the substrate and selected ones of the electrically conductive leads in said array of electrically conductive leads; and electrically conductive lines extending at the surface of the encapsulation of LDS material opposite the substrate between selected ones of said first vias and selected ones of said second vias.

8. A method, comprising:

molding an encapsulation of laser direct structuring (LDS) material over a first circuit and a second circuit, the encapsulation of LDS material having an upper surface;

applying laser beam energy to selected first locations of the upper surface of the encapsulation of LDS material to laser activate the LDS material and structure therein first and second vias extending through the LDS material between the upper surface and the first and second circuits, respectively;

applying laser beam energy to selected second locations of the upper surface of the encapsulation of LDS material to laser activate the LDS material and structure therein a connection line extending at the upper surface and coupling said first and second vias;

placing an electrode in contact with at least one of said selected first and second locations of the surface of the encapsulation of LDS material that are laser activated and structured, wherein said wherein the electrode provides an electrically conductive path to said at least one of said selected first and second locations; and electrolytically growing metal material onto said selected first and second locations of the surface of the encapsulation of LDS material that are laser activated and structured, wherein electrolytically growing metal material comprises exposing said selected first and second locations to an electrolyte carrying cations of metal material and reducing said cations to metal material via a current flowing through the electrically conductive path provided via said electrode.

9. The method of claim 8, wherein the electrolyte is an electrolyte carrying copper cations and metal material is metallic copper.

10. The method of claim 9, wherein said electrolyte carries SO2-4 anions.

11. The method of claim 8, wherein placing the electrode comprises placing a plurality of contact members at a plurality of selected first and second locations of the surface of the encapsulation of LDS material that are laser activated and structured.

12. The method of claim 11, wherein placing the plurality of contact members comprises deforming said plurality of contact members in response to contact with said plurality of selected first and second locations.

13. The method of claim 8, wherein the first and second circuits are supported by a substrate comprising an array of electrically conductive leads, the method further comprising:

applying laser beam energy to selected third locations of the upper surface of the encapsulation of LDS material to laser activate the LDS material and structure therein third and fourth vias extending through the LDS material between the upper surface and the array of electrically conductive leads; and applying laser beam energy to selected fourth locations of the upper surface of the encapsulation of LDS material to laser activate the LDS material and structure therein a further connection line extending at the upper surface and coupling said third and fourth vias.

* * * * *